(12) United States Patent
Iwazaki et al.

(10) Patent No.: US 9,169,980 B2
(45) Date of Patent: Oct. 27, 2015

(54) LIGHTING DEVICE AND DISPLAY DEVICE

(71) Applicant: KOHA CO., LTD., Tokyo (JP)

(72) Inventors: Hiroki Iwazaki, Tokyo (JP); Kentaro Tone, Tokyo (JP)

(73) Assignee: KOHA CO., LTD., Tokyo (JP)

( * ) Notice: Subject to any disclaimer, the term of this patent is extended or adjusted under 35 U.S.C. 154(b) by 0 days.

(21) Appl. No.: 14/219,993

(22) Filed: Mar. 19, 2014

(65) Prior Publication Data
US 2014/0293646 A1 Oct. 2, 2014

(30) Foreign Application Priority Data
Mar. 27, 2013 (JP) .................................. 2013-066249

(51) Int. Cl.
| F21V 21/00 | (2006.01) |
|---|---|
| F21K 99/00 | (2010.01) |
| F21S 4/00 | (2006.01) |
| F21V 19/00 | (2006.01) |
| G02F 1/1335 | (2006.01) |
| F21V 31/00 | (2006.01) |
| F21Y 101/02 | (2006.01) |
| F21Y 103/00 | (2006.01) |

(52) U.S. Cl.
CPC . *F21K 9/52* (2013.01); *F21S 4/008* (2013.01); *F21V 19/0045* (2013.01); *G02F 1/133603* (2013.01); *F21V 31/005* (2013.01); *F21Y 2101/02* (2013.01); *F21Y 2103/003* (2013.01)

(58) Field of Classification Search
CPC ..... F21K 9/52; F21V 31/005; F21V 19/0045; F21S 4/008; F21Y 2101/02; F21Y 2103/003; G02F 1/133603
USPC ........................................ 362/217.01–217.04
See application file for complete search history.

(56) References Cited

U.S. PATENT DOCUMENTS

| 2010/0177532 A1* | 7/2010 | Simon et al. .................. 362/555 |
| 2012/0162783 A1* | 6/2012 | Bemmerl et al. ............. 359/707 |

FOREIGN PATENT DOCUMENTS

| JP | 2004-109407 A | 4/2004 |
|---|---|---|
| JP | 2006-093148 A | 4/2006 |
| JP | 3150997 U | 5/2009 |
| JP | 2010-129507 A | 6/2010 |
| JP | 2011-014831 A | 1/2011 |
| JP | 2012-182117 A | 9/2012 |

* cited by examiner

*Primary Examiner* — Sean Gramling
*Assistant Examiner* — Gerald J Sufleta, II
(74) *Attorney, Agent, or Firm* — McGinn IP Law Group, PLLC.

(57) ABSTRACT

A lighting device includes a translucent member having the same cross sectional tubular shape throughout a longitudinal direction and including a lens that includes a light incident surface for receiving incident light and a pair of light exit surface for diffusing and emitting the light incident on the light incident surface to the outside, and a light-emitting portion mounted on a substrate and emitting the light toward a region including the light incident surface of the translucent member, where in the translucent member includes a pair of light guide portions for guiding the light incident on the light incident surface to a pair of the light exit surfaces so that the light incident on the light incident surface is diffused and emitted from the pair of light exit surfaces in a width direction that is orthogonal to the longitudinal direction.

21 Claims, 6 Drawing Sheets

LIGHTING DEVICE AND DISPLAY DEVICE

The present application is based on Japanese patent application No. 2013-066249 filed on Mar. 27, 2013, the entire contents of which are incorporated herein by reference.

BACKGROUND OF THE INVENTION

1. Field of the Invention

The invention relates to a lighting device and a display device.

2. Description of the Related Art

Conventionally, incandescent bulbs or fluorescent lamps are used as light sources of, e.g., backlights of illuminated signs and liquid crystal displays or lighting equipments, etc. In recent years, since it has become possible to output high power from LEDs (Light Emitting Diode) as a point light source and intensity of illumination usable for lighting can be obtained, LEDs have been diversified as a light source alternative to incandescent bulbs or fluorescent lamps.

A lighting device, in which an illuminated area per LED is increased, has been proposed as a device using this type of LEDs for lighting (see, e.g., JP-A-2011-14831).

The lighting device described in JP-A-2011-14831 is provided with an LED extending in a direction orthogonal to an optical axis direction (in a longitudinal direction), a substrate mounting the LED, and a lens is provided so as to seal the LED on the surface of the substrate, the lens having a shape extending along the longitudinal direction to spread light of the LED in a width direction of the LED (a direction orthogonal to the longitudinal direction of the LED and to the optical axis direction). A light incident surface of the lens is optically coupled to a light-emitting surface of the LED by a coupling member.

However, in case of the lighting device described in JP-A-2011-14831 which is configured such that a back surface of the substrate is exposed from the lens, outdoor use thereof may lead to corrosion of wiring of the substrate or short-circuit because of rain water, etc. Thus, there is a problem in waterproof properties when using the lighting device outdoors. Meanwhile, use of a cover, etc., protecting from rain water, etc., allows the lighting device to be used outdoors but causes problems of an increase in the number of components of the lighting device and the resulting complicated structure, and optical loss caused by the cover is also a problem.

SUMMARY OF THE INVENTION

Therefore, it is one of objects of the invention to provide a lighting device and a display device which have a simple structure and are excellent in waterproof properties.

According to one embodiment of the invention the following lighting device and display device are provided.

[1] A lighting device comprises:
a translucent member having a same cross sectional tubular shape throughout a longitudinal direction and comprising a lens that comprises a light incident surface for receiving an incident light and a pair of light exit surfaces for diffusing and emitting the incident light onto the light incident surface to an outside;
a substrate arranged inside the translucent member along the longitudinal direction; and
a light-emitting portion mounted on the substrate and emitting the light toward a region including the light incident surface of the translucent member,
wherein the light incident surface of the translucent member is provided facing the light-emitting portion, and wherein the lens of the translucent member comprises a pair of light guide portions for guiding the incident light onto the light incident surface to a pair of the light exit surfaces such that the incident light onto the light incident surface is diffused and emitted from the pair of light exit surfaces in a width direction that is orthogonal to the longitudinal direction.

[2] The lighting device according to [1], wherein the pair of light guide portions comprise a pair of reflecting surfaces for reflecting a portion of the incident light onto the light incident surface toward the width direction.

[3] The lighting device according to [2], wherein the pair of light guide portions has a V-shape and each portion of the translucent member has substantially the same thickness [4] The lighting device according to [1], wherein the translucent member comprises a pair of shoulder portions provided on both sides of the lens and substrate holders arranged so that a gap corresponding to a thickness of the substrate is provided between the substrate holders and the pair of shoulder portions, and the substrate is held between the pair of shoulder portions and the substrate holders.

[5] The lighting device according to [1], wherein the cross sectional shape of the translucent member is a shape formable by extrusion molding.

[6] The lighting device according to [1], wherein the a plurality of the light-emitting portions are mounted on one surface of each of two substrate or on both surfaces of the substrate, and the translucent member comprises a pair of lenses in opposite directions so that light emitted from the plurality of light-emitting portions is emitted through the pair of lenses in the opposite directions.

[7] The lighting device according to [1], wherein the translucent member contains a light-diffusing agent in an amount of not less than 0.1 mass % and not more than 3 mass % per 100 mass % of the translucent member.

[8] A display device comprises the lighting device according to [1].

EFFECTS OF THE INVENTION

According to one embodiment of the invention, a lighting device and a display device can be provided that have a simple structure and excellent in waterproof properties.

BRIEF DESCRIPTION OF THE DRAWINGS

Next, the present invention will be explained in more detail in conjunction with appended drawings, wherein.

DESCRIPTION OF THE PREFERRED EMBODIMENTS

Embodiments of the invention will be described below in reference to the drawings. It should be noted that constituent elements having the same functions are respectively denoted by the same reference numerals and the explanation thereof will be omitted.

First Embodiment

Figure 1:
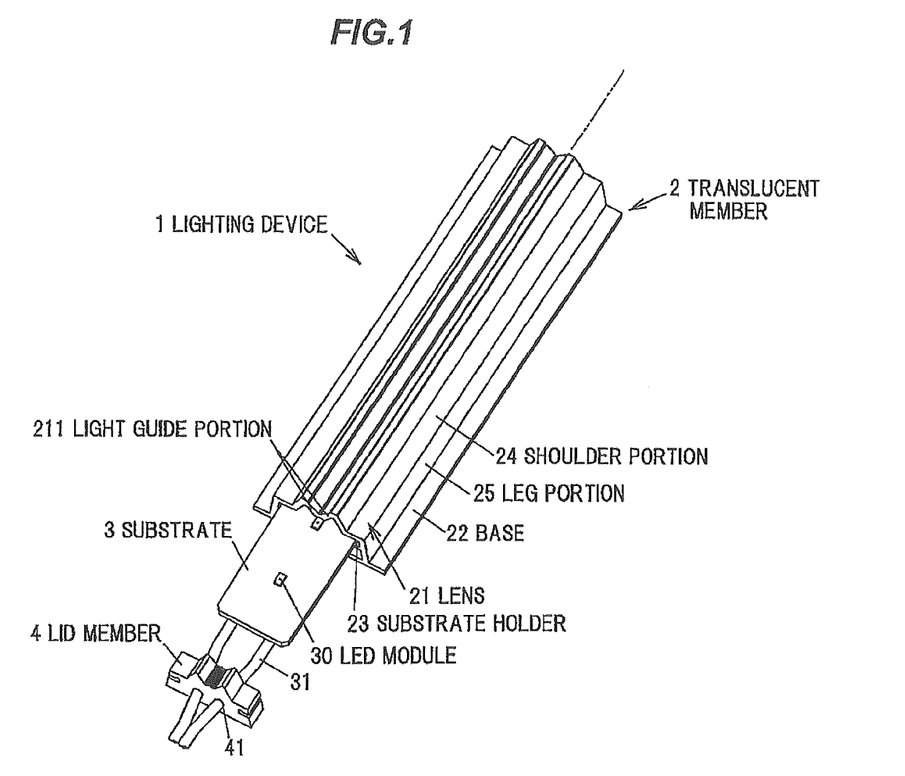
FIG. 1 is an expanded perspective view showing an example appearance of a lighting device in a first embodiment of the present invention.
Figure 2:
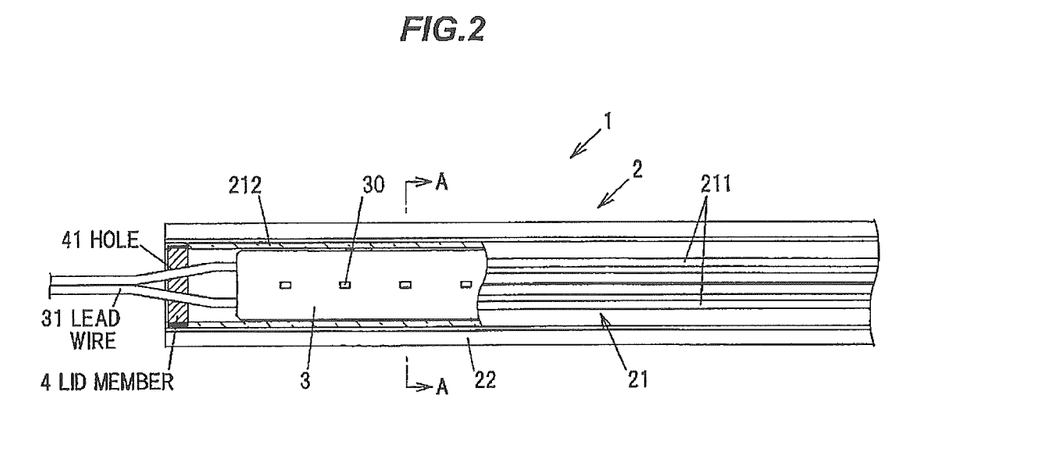
FIG. 2 is a partially ruptured plan view showing the lighting device shown in FIG. 1 as viewed from above.
Figure 3:
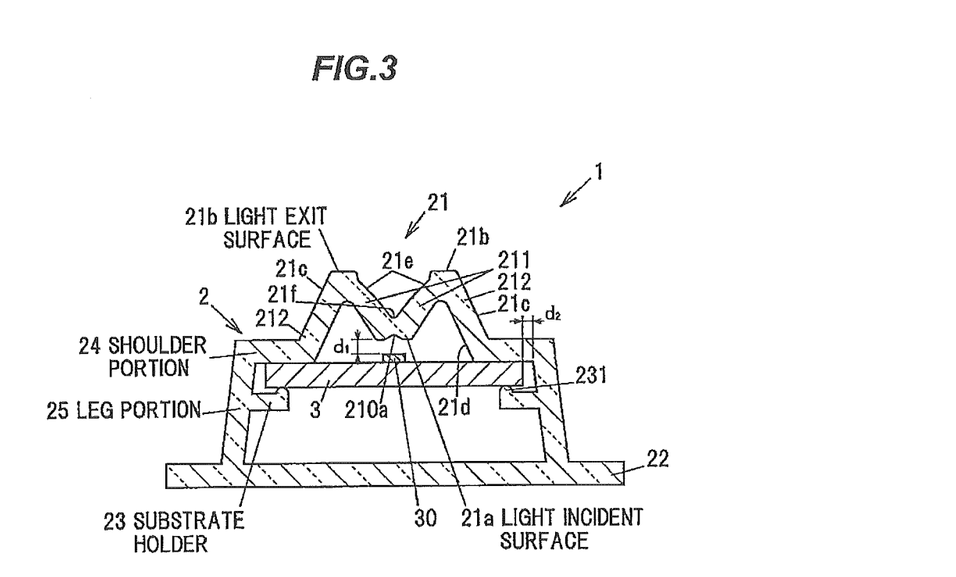
FIG. 3 is a cross sectional view taken on a line A-A of FIG. 2.

FIG. 1 is an expanded perspective view showing an example appearance of a lighting device in the first embodiment of the invention. FIG. 2 is a partially ruptured plan view showing the lighting device shown in FIG. 1 as viewed from above. FIG. 3 is a cross sectional view taken on the line A-A of FIG. 2.

A lighting device 1 is provided with a translucent member 2, a substrate 3 and a pair of lid members 4. The translucent member 2 has the same cross sectional shape throughout a longitudinal direction, which can be formed by extrusion molding. The substrate 3 mounts LED modules 30 as an example of plural light-emitting portions on a surface thereof and is arranged inside the translucent member 2 along a longitudinal direction of the translucent member 2. The pair of lid members 4 are respectively fitted to both longitudinal end portions of the translucent member 2.

Translucent Member

The translucent member 2 has, e.g., a tubular shape (a shape closed in a circumferential direction) and is provided with an M-shaped lens 21 diffusing and emitting light of the LED modules 30 in a width direction orthogonal to a longitudinal direction of the substrate 3, a base 22 serving as a bottom of the lighting device 1 and attached to a non-illustrated attachment target member, a pair of substrate holders 23 for holding the substrate 3, a pair of shoulder portions 24 located on both sides of the lens 21, and a pair of leg portions 25 each of which connects the shoulder portion 24 to the base 22.

The translucent member 2 is formed of a transparent resin such as PMMA (polymethylmethacrylate) or polycarbonate. The translucent member 2 is, e.g., extrusion-molded and all of the parts 21 to 25 are thereby integrally formed. The parts 21 to 25 may have substantially the same thickness or different thicknesses. In addition, in the translucent member 2, a diffusing agent having a different refractive index from a resin constituting the translucent member may be contained in an amount of not less than 0.1 mass % and not more than 3 mass % per 100 mass % of the translucent member 2. The translucent member 2 containing the diffusing agent allows light from the LED module 30 to be uniformly diffused and, when the lighting device 1 is used in a display device 10 which is described later, color unevenness or light emission unevenness of a display 100 can be suppressed.

Lens

The lens 21 is provided with a light incident surface 21a on which light from the LED module 30 is incident, a pair of light exit surfaces 21b, a pair of light exit surfaces 21c and a concave surface 21f from all of which the light incident on the light incident surface 21a is emitted to the outside, a pair of light guide portions 211 for guiding light incident through the light incident surface 21a to the light exit surfaces 21b and 21c, and connecting portions 212 each connecting the light guide portion 211 to the shoulder portion 24.

The light incident surface 21a of the lens 21 is a surface protruding toward the substrate 3 and facing the LED modules 30. The light incident surface 21a has a triangular recess 210a and a gap $d_1$ is provided between an end face of the recess 210a and the LED modules 30. The gap $d_1$ between the light incident surface 21a and the LED modules 30 is preferably 0.3 to 1.5 mm. Providing the gap $d_1$ suppresses damage to the LED modules 30 and also facilitates insertion of the substrate 3 into the translucent member 2. The light incident surface 21a is configured that light incident on the middle portion of the recess 210a is transmitted and emitted from the lens 21 and light incident on the remaining portion of the recess 210a is introduced into the pair of light guide portions 211.

The pair of light guide portions 211 of the lens 21 form a V-shape and is configured such that the light incident on the light incident surface 21a is emitted to the outside through the light exit surfaces 21b and 21c by total reflection at reflecting surfaces 21e or is emitted to the outside directly through the light exit surfaces 21b.

The connecting portions 212 are bent downward at both upper end portions of the pair of light guide portions 211 and extend from these end portions toward the substrate 3 in an oblique direction, thereby connecting the light guide portions 211 to the shoulder portions 24. The inner surface of the connecting portion 212 serves as a light incident surface 21d on which light emitted from the LED module 30 but not reaching the light incident surface 21a is incident. The outer surface of the connecting portion 212 serves as the light exit surface 21c.

Substrate Holder

Each substrate holder 23 has a raised portion 231 which is in contact with a lower surface of the substrate 3 and supports the substrate 3 from the lower side. In addition, the substrate holders 23 hold the substrate 3 so that gaps $d_2$ are provided between the inner surfaces of the leg portions 25 and widthwise end portions of the substrate 3. By providing the gaps $d_2$, it is possible to suppress damage to the substrate 3 and to the LED modules 30 when the translucent member 2 is deformed by vibration or an external force. Alternatively, the substrate holder 23 may be configured to hold the substrate 3 by a flat surface not having the raised portion 231.

Shoulder Portion and Leg Portion

The shoulder portion 24 is provided so as to extend from the connecting portion 212 in a width direction of the substrate 3. A lower surface of the shoulder portion 24 is in contact with an upper surface of the substrate 3 and, together with the substrate holder 23, holds the substrate 3.

The leg portion 25 extends downward from a widthwise outer edge of the shoulder portion 24 and is connected to the base 22. By the leg portion 25, the lens 21 and the shoulder portion 24 are connected to the base 22 and are supported.

Substrate

The substrate 3 is formed of a resin material and is, e.g., a glass epoxy substrate, etc. Plural LED modules 30 are mounted in a row on the surface of the substrate 3 along a longitudinal direction at certain intervals and electrodes of the LED modules 30 are connected to lead wires 31 by a non-illustrated wiring pattern. Note that, the LED modules 30 may be arranged in plural rows on the surface of the substrate 3 along the longitudinal direction of the substrate 3. Alternatively, it may be configured to mount one LED module 30 on the surface of the substrate 3.

Lid Member

As shown in FIGS. 1 and 2, the lid members 4 each have an outer peripheral surface in contact with an inner peripheral surface of the translucent member 2 and seal both end portions of the translucent member 2 to prevent rain water, etc., from entering the translucent member 2. In addition, the lid member 4 is configured to allow the lead wires 31 for supplying power to the substrate 3 to be introduced into the translucent member 2. In this case, holes 41 through which the lead wires 31 penetrate are provided on the lid member 4 and are sealed by resin injection or O-rings, etc., to prevent rain water, etc., from entering the translucent member 2.

LED Module

Figure 4:
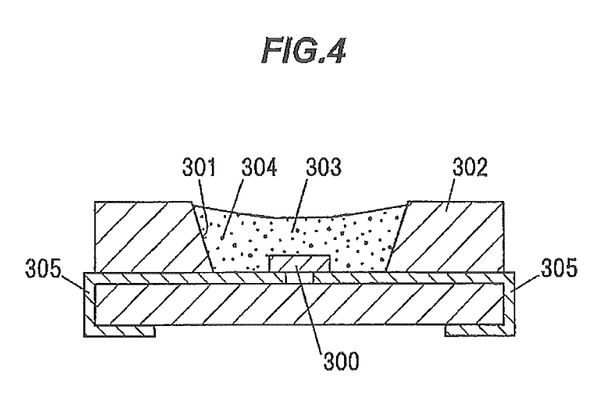
FIG. 4 is a cross sectional view showing an example of an LED module.

FIG. 4 is a cross sectional view showing an example of the LED module 30. The LED module 30 has a blue LED element 300 emitting blue light, a package 302 housing the blue LED element 300 arranged on a bottom surface of a recessed portion 301, a sealing resin 303 sealing the blue LED element 300 and containing a phosphor 304 which emits yellow light by being excited by blue light, and a pair of leads 305 connecting the lead wires 31 to electrodes of the blue LED element 300. The LED module 30 emits white light as a mixture of blue light and yellow light.

As the blue LED element 300, it is possible to use an element formed of, e.g., a GaN-based compound semiconductor with an emission wavelength range of 450 to 460 nm. As the phosphor 304, it is possible to use a silicate-based phosphor or a garnet-based phosphor such as YAG (Yttrium Aluminum Garnet) phosphor. Note that, the LED module 30 may emit light with a color other than white and, for example, LED elements with three colors of red, green and blue, may be used in place of the blue LED element 300 to emit light with various colors. In addition, it may be configured such that an LED element is mounted as a light-emitting portion directly on the substrate 3 instead of using the LED module 30 and is sealed with the sealing resin 303.

Operation of Lighting Device

Figure 5:
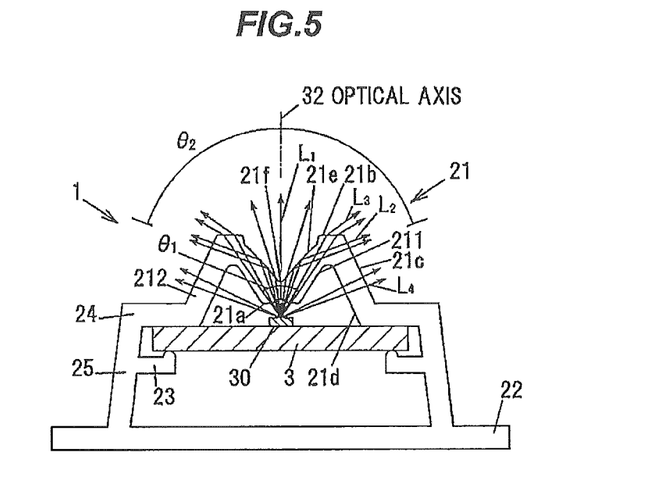
FIG. 5 is a schematic view showing a portion of light beam emitted from the lighting device in the first embodiment.

FIG. 5 is a schematic view showing a portion of light beam emitted from the lighting device 1. When power is supplied from a non-illustrated power source to the LED module 30 on the substrate 3 through the lead wires 31, the LED module 30 emits white light.

The light from the LED module 30 is emitted to the outside from the upper side, obliquely upper side and lateral sides of the translucent member 2 depending on an emission angle θ, as shown in FIG. 5.

Effects of the First Embodiment

The first embodiment achieves the following effects.

(1) The translucent member 2 in which the substrate 3 is arranged is composed of the integrated parts 21 to 25 and rain water, etc., thus does not enter the translucent member 2. This allows the lighting device 1 to have the increased waterproof properties while having a simple structure and requiring less components.

(2) By modularizing the lighting device 1 having plural LED modules 30 arranged inside the translucent member 2 along the longitudinal direction of the substrate 3, it is possible to reduce man-hour for installing the lighting device 1 as compared to lighting devices modularized per LED module.

(3) The translucent member 2 is provided with the lens 21 configured that light emitted from the LED module 30 and having a given divergence angle $θ_1$ (e.g., 60 to 100°) is incident on the light incident surface 21a and is emitted to the outside at a divergence angle $θ_2$ which is widened in a width direction of the substrate 3 (e.g., 100 to 160°, $θ_2>θ_1$). Therefore, it is possible to illuminate a wide area.

(4) By configuring the lens 21 to be provided with the V-shaped light guide portions 211, it is possible to form each portion of the translucent member 2 to have substantially the same thickness. Thus, it is possible to form the translucent member 2 having a precise shape with less strain when the translucent member 2 is formed by extrusion molding.

Second Embodiment

Figure 6:
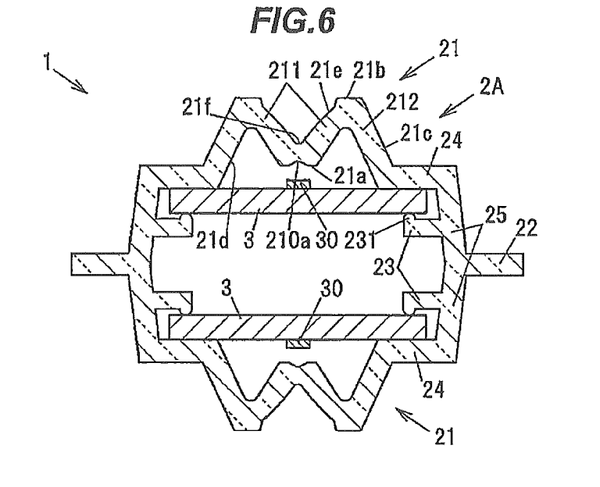
FIG. 6 is a cross sectional view showing a lighting device in a second embodiment of the invention.

FIG. 6 is a cross sectional view showing a lighting device in the second embodiment of the invention. While light is emitted from one side of the lighting device 1 in the first embodiment, light is emitted from both sides of the lighting device 1 in the second embodiment. The features different from the first embodiment will be mainly described below.

The lighting device 1 in the second embodiment is provided with a translucent member 2A having a pair of lenses 21 and a pair of substrates 3 respectively corresponding to the lenses 21. The translucent member 2A is provided with the pair of lenses 21 arranged at positions facing each other, the leg portions 25 serving as side surfaces of the translucent member 2A in a width direction, the bases 22 protruding from the leg portions 25, and the substrate holders 23 respectively holding the pair of substrates 3.

The pair of substrates 3 are arranged inside the translucent member 2A so that back surfaces thereof face each other, thereby allowing the LED modules 30 to emit light in opposite directions.

Effects of the Second Embodiment

In the second embodiment, it is possible to illuminate in the opposite directions by one lighting device 1 and it is thus possible to reduce the number of the lighting devices 1 when illuminating in the opposite direction.

Third Embodiment

Figure 7:
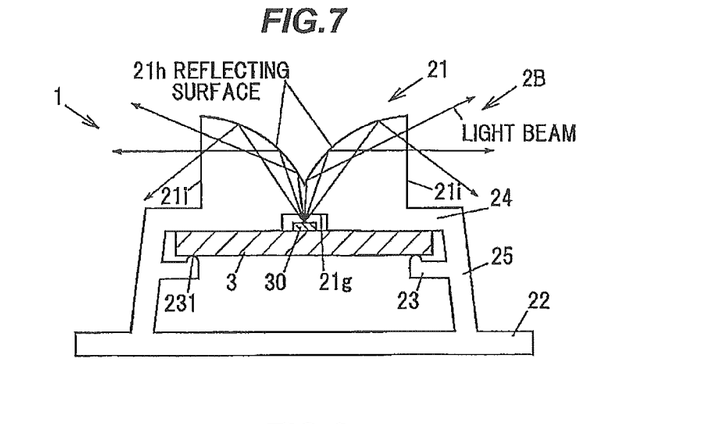
FIG. 7 is a cross sectional view showing a lighting device in a third embodiment of the invention.

FIG. 7 is a cross sectional view showing a lighting device in the third embodiment of the invention. While the lens 21 of the translucent member 2 in the first embodiment has a pair of light guide portions 211 for guiding the incident light to the light exit surfaces 21b, the lens 21 of a translucent member 2B in the third embodiment has a pair of reflecting surfaces 21h in place of the pair of light guide portions 211. The features different from the first embodiment will be mainly described below.

The lens 21 of the translucent member 2B in the third embodiment has a light incident surface 21g on which light from the LED module 30 is incident, a pair of reflecting surfaces 21h for reflecting the light incident through the incident surface 21g toward a width direction, i.e., lateral sides (a direction orthogonal to an optical axis 32), as well as obliquely upper side and obliquely downside of the substrate 3, and light exit surfaces 21i from which the light reflected by the reflecting surfaces 21h is emitted to the outside.

The light incident surface 21g of the lens 21 is provided on a surface of the lens 21 facing the LED module 30 and is formed of a recessed portion which houses the LED module 30. The reflecting surface 21h of the lens 21 is, e.g., a curved surface such as parabolic or oval surface.

Effects of the Third Embodiment

In the third embodiment, providing the reflecting surfaces 21h allows a lot of light to be emitted in the width direction of the substrate 3.

Fourth Embodiment

Figure 8:
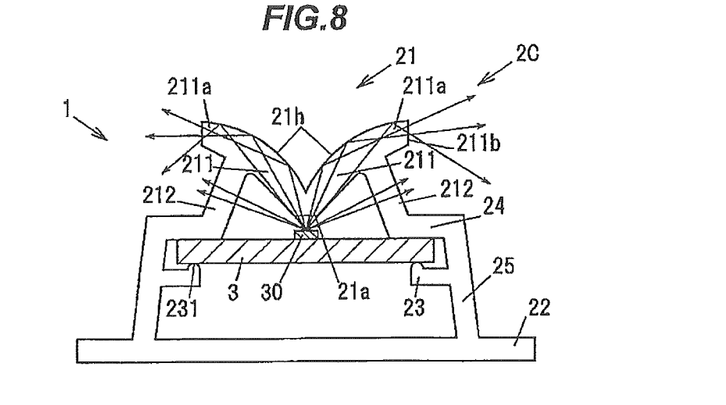
FIG. 8 is a cross sectional view showing a lighting device in a fourth embodiment of the invention.

FIG. 8 is a cross sectional view showing a lighting device in the fourth embodiment of the invention. While the light exit surface 21b of the lens 21 in the first embodiment faces upward, a light exit surface 211b in the fourth embodiment is configured to face the lateral side. The features different from the first and third embodiments will be mainly described below.

The lens 21 of a translucent member 2C in the fourth embodiment has the reflecting surface 21h formed of a curved surface and the light guide portions 211 on each of which an end portion 211a is formed to extend outward beyond the connecting portion 212. The light guide portion 211 is configured such that the light emitted from the LED module 30 and then reached the reflecting surface 21h is reflected toward the width direction, i.e., lateral sides, as well as obliquely upper side and obliquely downside of the substrate 3 and is emitted from the light exit surface 211b of the lens 21. Each portion of the translucent member 2C has substantially the same thickness.

Effects of the Fourth Embodiment

In the fourth embodiment, it is possible to emit a lot of light in the width direction of the substrate 3 even though the thickness is substantially the same throughout the translucent member 2C.

Fifth Embodiment

Figure 9:
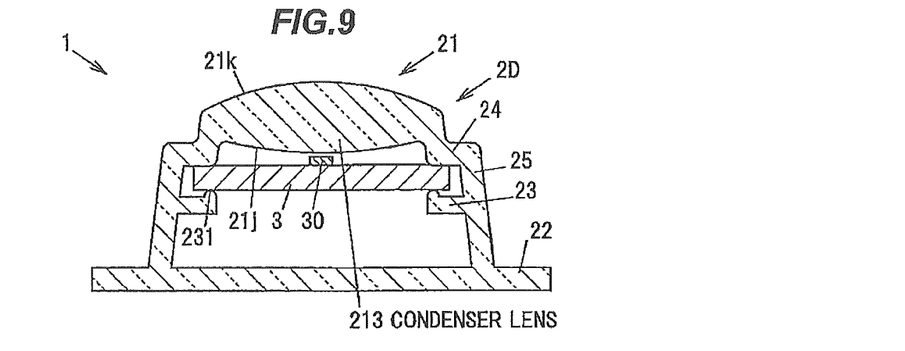
FIG. 9 is a cross sectional view showing a lighting device in a fifth embodiment of the invention.

FIG. 9 is a cross sectional view showing a lighting device in the fifth embodiment of the invention. While the light emitted from the LED module 30 is diffused in the width direction of the substrate 3 and then emitted to the outside in the first embodiment, light emitted from the LED module 30 is concentrated and then emitted to the outside in the fifth embodiment. The features different from the first embodiment will be mainly described below.

A translucent member 2D in the fifth embodiment has a condenser lens 213 as an example of a light condensing portion provided at a position where the lens 21 faces the LED module 30. Other than this, the translucent member 2D has the base 22, the substrate holders 23, the shoulder portions 24 and the leg portions 25 in the same manner as the first embodiment.

The condenser lens 213 has a light incident surface 21j convex toward the LED module 30 and a light exit surface 21k convex toward the side opposite to the LED module 30. The incident light is concentrated and light with high directivity is emitted to the outside. Note that, the condenser lens 213 may be formed to have a non-illustrated focal point so that light emitted from the LED module 30 is focused at the focal point. In addition, either the light incident surface 21j or the light exit surface 21k of the condenser lens 213 may be a flat surface.

Effects of the Fifth Embodiment

In the fifth embodiment, it is possible to emit light with high directivity to the outside by providing the condenser lens 213 on the translucent member 2D.

Sixth Embodiment

Figure 10:
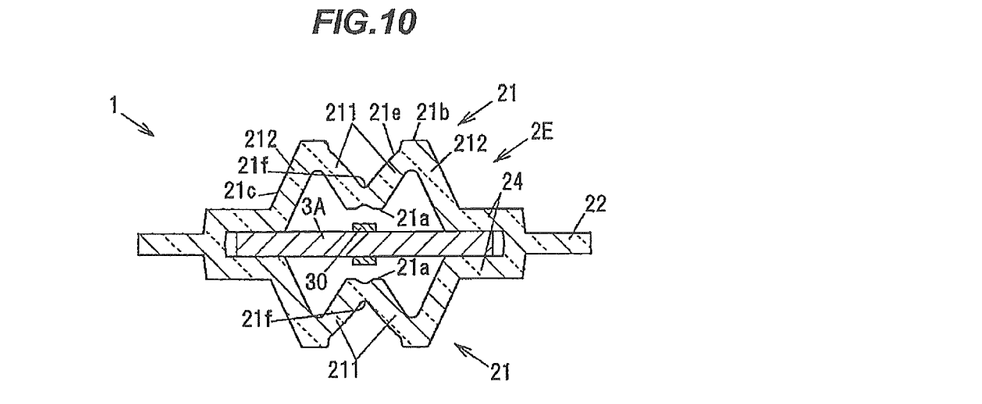
FIG. 10 is a cross sectional view showing a lighting device in a sixth embodiment of the invention.

FIG. 10 is a cross sectional view showing a lighting device in the sixth embodiment of the invention. While light is emitted in the opposite directions by providing a pair of substrates 3 in the second embodiment, light is emitted in the opposite directions by one substrate 3A in the sixth embodiment. The features different from the first and second embodiments will be mainly described below.

The lighting device 1 in the sixth embodiment is provided with a translucent member 2E having the shoulder portions 24 which vertically sandwich and hold the substrate 3A, and the substrate 3A mounting the LED modules 30 on both surfaces.

The translucent member 2E has a pair of lenses 21 and the bases 22 in the same manner as the second embodiment and pairs of shoulder portions 24 respectively provided on and under the bases 22. The shoulder portions 24 of the translucent member 2E hold the substrate 3A so that gaps are provided between the inner end surfaces of the bases 22 and side surfaces of the substrate 3A.

Effects of the Sixth Embodiment

In the sixth embodiment, by mounting the LED modules 30 on both sides of one substrate 3A, it is possible to reduce the number of components as compared to the case where two lighting devices 1 of FIG. 1 are used. In addition, it is possible to reduce the height of the lighting device 1 and this allows the lighting device 1 to be arranged in a narrow space.

Seventh Embodiment

Figure 11:
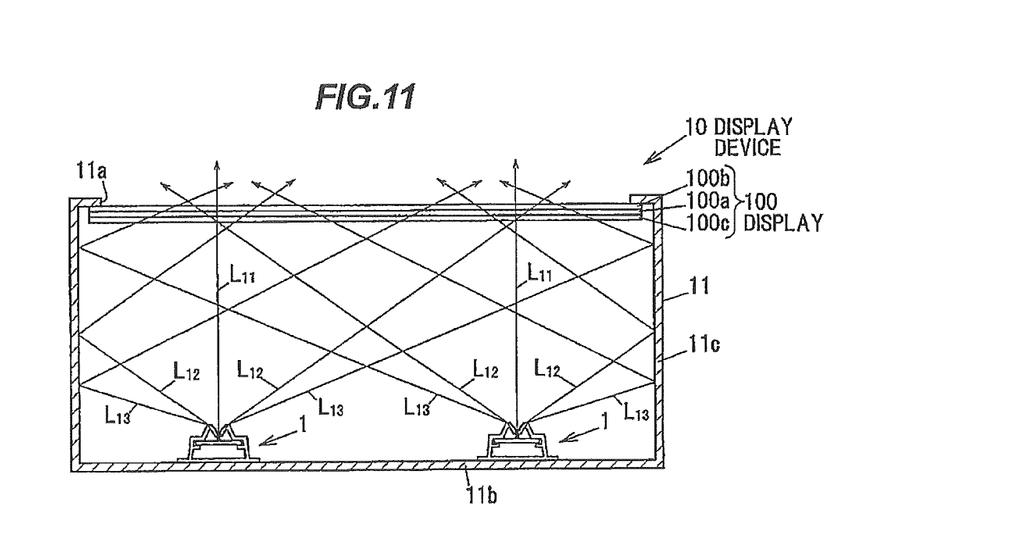
FIG. 11 is a cross sectional view showing an example of a display device in a seventh embodiment of the invention.

FIG. 11 is a cross sectional view showing an example of a display device in the seventh embodiment of the invention. In the seventh embodiment, the display device 10 in which the lighting devices 1 in the first embodiment are arranged will be described.

The display device 10 in the seventh embodiment is provided with a box-shaped housing 11 having an opening 11a, a display 100 provided at the opening 11a, and plural (two in the seventh embodiment) lighting devices 1 attached to a backplate 11b of the housing 11 to illuminate the display 100 from the back side. Note that, the number of the lighting devices 1 used in the display device 10 may be one.

The housing 11 of the display device 10 is formed of a metal or a resin material such as polycarbonate and is provided with four side plates 11c which surround the backplate 11b. A metal sheet such as aluminum sheet is attached to inner surfaces of the side plates 11c to increase light reflection efficiency. Note that, white coating may be applied to the inner surfaces of the side plates 11c instead of providing the metal sheet. Alternatively, the housing 11 may be formed of a white resin material.

The display 100 of the display device 10 is formed by laminating a display panel 100a, a transparent panel 110b and a scattering panel 110c. The transparent panel 110b and the scattering panel 110c are formed of, e.g., a transparent resin or transparent glass, etc. An advertisement, etc. is printed on the surface of the display panel 100a. The transparent panel 110b protects the display panel 100a. The scattering panel 110c has microasperities on front and back surfaces to scatter the incident light.

Operation of Display Device

When power is supplied from a non-illustrated power source to each lighting device 1, light is emitted from the plural LED modules 30 of each lighting device 1. Light beams $L_{11}$ to $L_{13}$ emitted from the LED modules 30 are diffused upward and obliquely upward by the lens 21 of the translucent member 2 and are emitted from the lighting device 1. The light beam $L_{11}$ emitted upward from the lighting device 1 directly reaches and illuminates the display 100. A portion of the light beams $L_{12}$ and $L_{13}$ emitted obliquely upward from the lighting device 1 directly reaches and illuminates the display 100, and the remaining portion is reflected by the inner surfaces of the side plates 11c of the housing 11 and then reaches and illuminates the display 100.

Effects of the Seventh Embodiment

In the seventh embodiment, it is possible to uniformly illuminate the display 100 of the display device 10 by the lighting device 1 provided with the lens 21 which diffuses and emits light in the width direction of the substrate 3. In addition, it is possible to suppress color unevenness or light emission unevenness due to the position of the lighting device 1 and the shape and structure of the lens 21. Note that, although the display device 10 using the lighting devices of the first embodiment has been described in the seventh embodiment, the lighting device 1 in the other embodiments may be used in the display device 10.

Modification

It should be noted that the embodiments of the invention are not limited to the embodiments described above and various modifications and changes can be made without departing from the gist of the invention. For example, the light incident surface, the light exit surface or the reflecting surface of the lens 21 may be roughened so that light emitted from the LED module 30 is uniformly diffused.

In addition, although it has been described that the lighting device 1 is provided with the LED modules 30 having a substantially square shape as viewed from the light emitting side, the lighting device 1 may have one or plural rectangular LED modules extending along the longitudinal direction of the substrate 3 as viewed from the light emitting side.

In addition, the translucent member 2 may have a shape other than the tubular shape, e.g., may have a shape partially having an opening along the longitudinal direction of the substrate 3.

INDUSTRIAL APPLICABILITY

The present invention can be used for backlights of liquid crystal displays, lighting devices for advertising displays, lighting devices for automatic vending machines, indoor lighting devices, desk lamps, automotive lamps and street lights, etc.

What is claimed is:

1. A lighting device, comprising:
   a translucent member formed integrally, having a same cross sectional tubular shape throughout a longitudinal direction, and comprising a lens that comprises a light incident surface for receiving an incident light and a pair of light exit surfaces for diffusing and emitting the incident light onto the light incident surface to an outside;
   a substrate arranged inside the translucent member along the longitudinal direction; and
   plural of light-emitting portions mounted on the substrate and emitting the light toward a region including the light incident surface of the translucent member,
   wherein the light incident surface of the translucent member is provided facing the light-emitting portions,
   wherein the lens of the translucent member comprises:
      a pair of light guide portions for guiding the incident light onto the light incident surface to a pair of the light exit surfaces such that the incident light onto the light incident surface is diffused and emitted from the pair of light exit surfaces in a width direction that is orthogonal to the longitudinal direction;
      a pair of shoulder portions holding an upper surface of the substrate; and
      a pair of substrate holders holding a lower surface of the substrate,
   wherein, in a cross-sectional view, the translucent member encloses the substrate and the plural of light-emitting portions,
   wherein the translucent member is monolithically formed with the lens, and
   wherein edges of the substrate are sandwiched between the pair of shoulder portions and the pair of substrate holders.

2. The lighting device according to claim 1, wherein the pair of light guide portions comprises a pair of reflecting surfaces for reflecting a portion of the incident light onto the light incident surface toward the width direction.

3. The lighting device according to claim 2, wherein the pair of light guide portions has a V-shape, and each portion of the translucent member has substantially a same thickness.

4. The lighting device according to claim 1, wherein the translucent member further comprises the pair of shoulder portions provided on both sides of the lens and the substrate holders arranged so that a gap corresponding to a thickness of the substrate is provided between the substrate holders and the pair of shoulder portions, and
   wherein the substrate is held between the pair of shoulder portions and the substrate holders.

5. The lighting device according to claim 1, wherein the cross sectional shape of the translucent member includes a shape formable by extrusion molding.

6. The lighting device according to claim 1, wherein the plural of the light-emitting portions are mounted on one surface of each of two substrate or on both surfaces of the substrate, and the translucent member comprises a pair of lenses in opposite directions so that light emitted from the plural of light-emitting portions is emitted through the pair of lenses in the opposite directions.

7. The lighting device according to claim 1, wherein the translucent member contains a light-diffusing agent in an amount of not less than 0.1 mass % and not more than 3 mass % per 100 mass % of the translucent member.

8. A display device, comprising the lighting device according to claim 1.

9. The lighting device according to claim 1, wherein a single integral piece extends through an entirety of the translucent member.

10. The lighting device according to claim 1, wherein an entirety of the translucent member is extrusion molded in a single piece.

11. The lighting device according to claim 1, wherein an entirety of the substrate is arranged inside the translucent member along the longitudinal direction.

12. The lighting device according to claim 1, wherein the translucent member further comprises:
   a base defining a bottom of the lighting device; and
   a pair of leg portions each connecting the shoulder portion to the base.

13. The lighting device according to claim 12, wherein the lens is an integral part of the base, the pair of substrate holders, the pair of shoulder portions, and the pair of leg portions.

14. The lighting device according to claim 13, wherein a bottom surface of the pair of the shoulder portions is disposed on an upper surface of the substrate.

15. The lighting device according to claim 14, wherein the pair of substrate holders extends from the pair of the leg portions to a bottom surface of the substrate.

16. The lighting device according to claim 15, wherein the pair of the leg portions extends from the pair of substrate holders to the base.

17. The lighting device according to claim 16, wherein the lens, the base, the pair of substrate holders, the pair of shoulder portions, and the pair of leg portions include a same transparent resin.

18. The lighting device according to claim 16, wherein an entirety of the lens, the base, the pair of substrate holders, the pair of shoulder portions, and the pair of leg portions includes a same transparent resin.

19. The lighting device according to claim 1, wherein an entirety of the translucent member includes a same material.

20. The lighting device according to claim 16, wherein an entirety of the lens, the base, the pair of substrate holders, the pair of shoulder portions, and the pair of leg portions consists of a same material.

21. The lighting device according to claim 1, wherein the lens is formed so that the light emitted from the plural light-emitting portions is incident on the light incident surface and is emitted to the outside at a divergence angle of 100° to 160° which is diffused in a width direction of the substrate.

* * * * *